United States Patent
Lee et al.

[11] Patent Number: 6,154,079
[45] Date of Patent: Nov. 28, 2000

[54] NEGATIVE DELAY CIRCUIT OPERABLE IN WIDE BAND FREQUENCY

[75] Inventors: Jae-Goo Lee, Kyungki-Do; Young-Hyun Jun, Seoul, both of Rep. of Korea

[73] Assignee: LG Semicon Co., Ltd., Cheongju, Rep. of Korea

[21] Appl. No.: 09/177,818

[22] Filed: Oct. 23, 1998

Related U.S. Application Data

[63] Continuation-in-part of application No. 08/873,860, Jun. 12, 1997, Pat. No. 5,945,861.

[30] Foreign Application Priority Data

Oct. 24, 1997 [KR] Rep. of Korea ............................ 54793

[51] Int. Cl.[7] ........................................................ H03K 5/14
[52] U.S. Cl. ............................................ 327/276; 327/277
[58] Field of Search ................................... 327/269, 270, 327/271, 276, 277, 284, 285

[56] References Cited

U.S. PATENT DOCUMENTS

| | | | |
|---|---|---|---|
| 3,248,657 | 4/1966 | Turecki | 327/269 |
| 3,588,707 | 6/1971 | Manship | 327/269 |
| 3,619,669 | 11/1971 | Wheeler | 327/277 |
| 3,624,519 | 11/1971 | Beydler | 327/277 |
| 4,443,766 | 4/1984 | Belton, Jr. | 327/271 |
| 4,618,787 | 10/1986 | Jacsier et al. | 327/277 |
| 4,675,612 | 6/1987 | Adams et al. | 327/152 |
| 4,677,499 | 6/1987 | Shirota et al. | 327/271 |
| 4,713,621 | 12/1987 | Nakamura et al. | 327/269 |
| 5,313,501 | 5/1994 | Thacker | 375/117 |
| 5,451,894 | 9/1995 | Guo | 327/277 |
| 5,465,076 | 11/1995 | Yamauchi et al. | 327/277 |
| 5,467,041 | 11/1995 | Baba et al. | 327/276 |
| 5,537,069 | 7/1996 | Volk | 327/152 |
| 5,589,788 | 12/1996 | Goto | 327/276 |
| 5,708,382 | 1/1998 | Park | 327/277 |
| 5,764,092 | 6/1998 | Wada et al. | 327/271 |

*Primary Examiner*—Tuan T. Lam
*Attorney, Agent, or Firm*—Fleshner & Kim, LLP

[57] ABSTRACT

A negative delay circuit (NDC) has an NDC array operated in a high frequency. The circuit varies a number of unit delay stages at an input stage of the NDC array according to a locking fail signal in a low frequency region. The NDC can carry out a negative delay operation in a wide band even when a number of the stages in the NDC array is small. The present invention decreases a size of a chip, and in addition, reduces an unnecessary current consumption by preventing a locking from re-occurring at a stage in a back portion because the NDC array has a delay value less than one clock.

22 Claims, 5 Drawing Sheets

FIG. 5A  RD 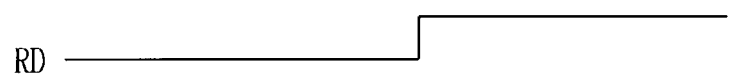
FIG. 5B  CLK_D' 
FIG. 5C  CT 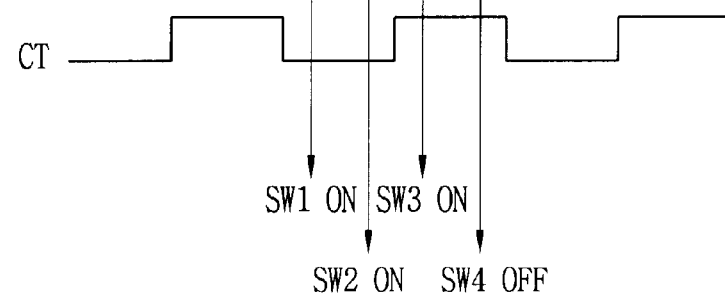

NEGATIVE DELAY CIRCUIT OPERABLE IN WIDE BAND FREQUENCY

This application is a continuation-in-part (CIP) application of U.S. application Ser. No. 08/873,860 (pending) filed Jun. 12, 1997, now U.S. Pat. No. 5,945,861 which is hereby incorporated by reference.

BACKGROUND OF THE INVENTION

1. Field of the Invention

The present invention relates to a delay circuit, and in particular to a negative delay circuit (NDC) operable in a wide band frequency.

2. Background of the Related Art

As memory device technology advances, a memory device operates at higher speeds. The internal clock signal for a memory chip is generally obtained by delaying an external clock signal for a predetermined period time. However, there is a limit for delaying the external clock signal. For example, when accessing the data of the memory device using an internal clock signal which is based on a delayed external clock signal, the access time is increased.

Therefore, the delay time between an external clock signal and an internal clock signal is reduced by using a PLL (Phase Locked Loop) or a DLL (Delay Locked Loop) or the internal clock signal is generated more rapidly than the external clock signal. The process in which the internal clock signal is more rapidly generated than the external clock signal is called a negative delay. When using the PLL or DLL, a few hundreds of clock cycles are needed for providing a locked clock signal. In addition, the PLL or DLL increases the current consumption.

SUMMARY OF THE INVENTION

An object of the present invention is to provide a delay circuit which overcomes the problems of the related art.

Another object of the present invention is to reduce a size of a chip.

A further object of the present invention is to operate in wide band.

A further object of the present invention is to carry out a locking with a negative delay circuit NDC array in a high frequency region and vary a number of unit delay stages positioned at an input terminal of the NDC array in a low frequency region.

Another object of the present invention is to reduce current consumption.

A further object of the present invention is to prevent a multi-locking phenomenon.

Still another object of the present invention is to provide an accurately locked clock signal.

The advantages, features and/or object may be achieved in whole or in part by maintaining the level of a signal to a predetermined level after a unit delay terminal in which a locking phenomenon occurs when a locking phenomenon occurs in a predetermined unit delay terminal in a high frequency region.

The present invention may be achieved in a whole or in parts by a negative delay circuit comprising: an input buffer for buffering an external clock signal; a variable delay unit having a plurality of unit delay stages, each unit delay stage being coupled to a clock signal line by a switch in response to a switch control signal such that an output of the input buffer is delayed; a negative delay circuit (NDC) array coupled to the clock signal line for receiving an output of the delay variable unit and outputting a locked enable signal; and a switch control unit for detecting a locking fail signal from the NDC array and outputting a corresponding switch control signal to the delay variable unit such that corresponding unit delay stages are coupled to the clock signal line.

The present invention may be also achieved in part or in whole by a negative delay circuit including: an input buffer buffering an external clock signal; unit delay stages sequentially delaying an output of the input buffer; a delay variable unit sequentially delaying an output of the delay unit by varying a number of the unit delay stages according to switch control signals; an NDC array receiving the output of the delay variable unit, and outputting a locked internal clock signal; and a switch control unit outputting the switch control signals to the delay variable unit by detecting a locking fail signal from the NDC array.

The present invention may be also achieved in part or in whole by a multi-locking prevention circuit for a negative delay circuit which includes a delay unit for sequentially delaying external clock signals through a plurality of unit delay terminals, a sampling and computation unit for maintaining the levels of signals from the unit delay terminals connected after a predetermined unit delay terminal, in which a locking phenomenon occurs, to a predetermined level when a delay clock signal among a plurality of delay clock signals from the unit delay terminals is locked, and an output unit for outputting a delay clock signal locked to an external clock signal in accordance with an output from the sampling and computation unit.

The present invention may be also achieved in part or in while by a signal modeling circuit, comprising: a delay unit that sequentially delays a first signal to generate a plurality of delayed signals; and means for selecting one of the plurality of delayed signals when a transiting edge of the first signal is between two transiting edges of two delayed signals by a prescribed time period such that the selected delayed signal is outputted as a modeled signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 5A to 5C are diagrams respectively illustrating input waveforms of the switch control unit in FIG. 4.

DETAILED DESCRIPTION OF PREFERRED EMBODIMENTS

Figure 1:
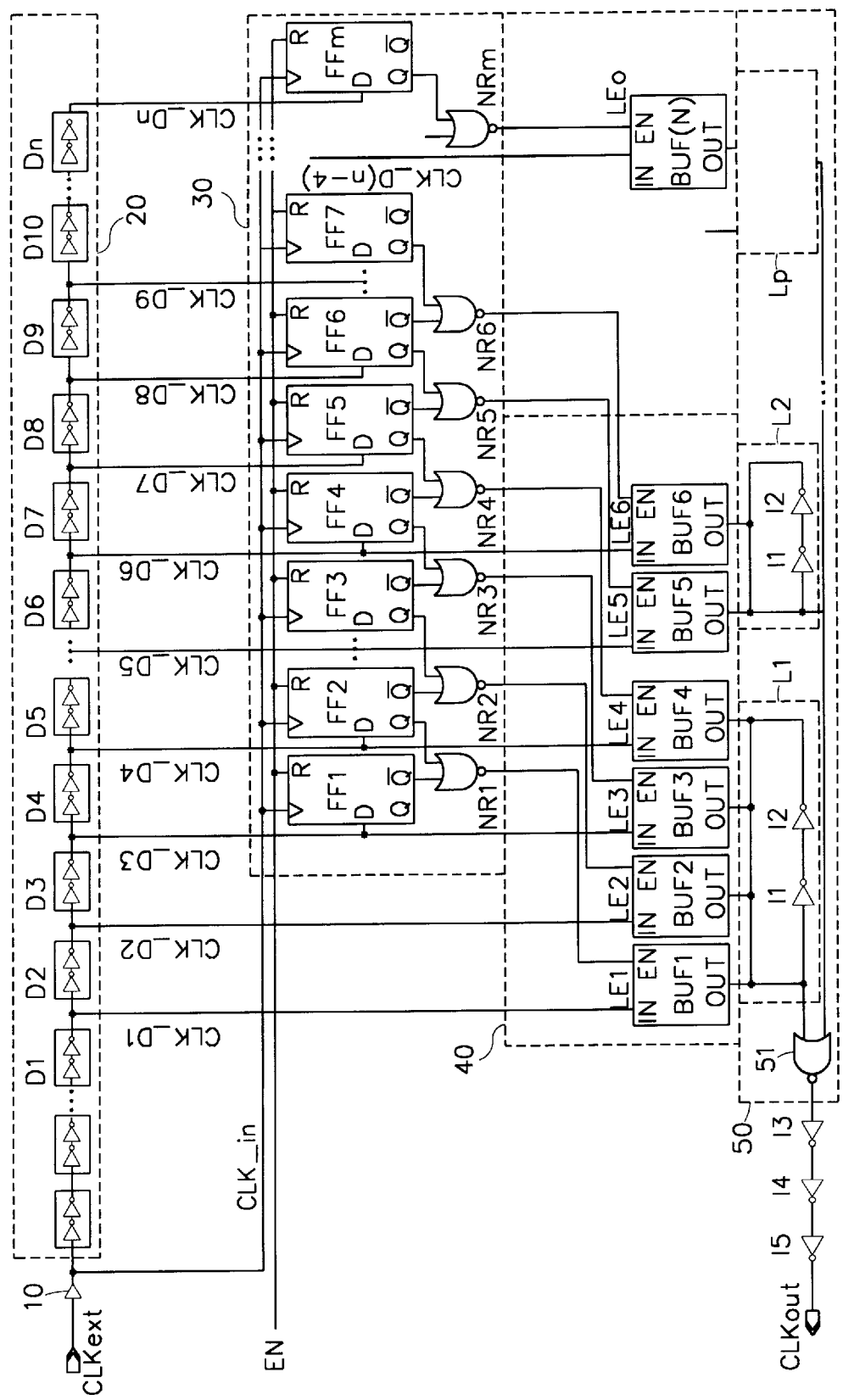
FIG. 1 is a circuit diagram illustrating a negative delay circuit in accordance with a preferred embodiment of the present invention.

FIG. 1 illustrates a negative delay circuit in accordance with a first preferred embodiment, which includes an input buffer 10 receiving an external clock signal CLKext, a delay unit 20, a sampling unit and computation unit 30, an output unit having a first output unit 40 and a second output unit 50. The second output buffer 50 is coupled to a series of inverters I3, I4 and I5, which provide an internal clock signal CLKout.

The input buffer 10 buffers an external clock signal CLKext to provide an input clock signal CLKin. The delay unit 20 receives the input clock signal CLKin, and includes a plurality of unit delay terminals D1 through Dn, which sequentially delays the input clock signal CLKin from the input buffer 10 to provide a plurality of delayed clock signals CLK_D1–CLK_Dn. To provide the delay, the delay unit includes a plurality of inverters coupled in series. In this embodiment, two inverters are serially connected to form each unit delay terminal. Further, two extra unit delay terminals 21 and 22 are used to further delay the input clock signal CLKin. The extra unit delay terminals may or may not be used for coupling to the sampling and computation unit 30, and the number of inverters can be varied based on the desired delay for generating the plurality of delayed clock signals CLK_D1–CLK_Dn.

The sampling and computation unit 30 samples the delayed clock signals from the unit delay terminals in accordance with the clock signal CLKin, sequentially performs a logical operation on the same, and outputs locking enable signals LE1–LEo. In this preferred embodiment, the sampling and computation unit 30 includes a plurality of flip-flops FF1 through FFm and a plurality of NOR-gates NR1 to NRm.

Each flip-flop FF1 through FFm samples the corresponding delayed clock signal CLK_D1–CLK_Dn of corresponding unit delay terminals D1 through Dn received at each input terminal D with the input clock signal CLKin received at each clock terminal. Each set/reset terminal R of the flip-flops is coupled to receive an enable signal EN. The flip-flops are enabled by an enabled signal EN of a high level, and are reset by an enable signal EN of a low level. The plurality of NOR-gates NR1 through NRm sequentially compares the outputs Q and /Q from the flip-flops FF1 through FFm and outputs a locking enable signal LEo.

When a delayed clock signal from a unit delay terminal is locked, e.g., when a transiting edge of the input clock signal CLKin is preferably about ½ in-between transiting edges of two delayed clock signals CLK_D(n−1) and CLK_Dn, the flip-flop coupled to the clock signal CLK_D(n−1) and the flip-flops thereafter output low and high level signals, respectively, at the output terminals Q and /Q of the flip-flops. The flip-flops coupled to the clock signal prior to CLK_D(n−1), i.e., flip-flops coupled to unlocked delayed signals of the unit delay terminal, output high and low levels at the output terminals Q and /Q, respectively, of the flip-flops.

FIG. 1 illustrates the flip-flops FF1–FFm coupled to sampled clock signals CLK_D1–CLK_Dn, respectively. However, the flip flops FF1–FFm may be coupled to any corresponding unit delay terminals D1–Dn, 21 and 22 in accordance with the frequency band, preferably between 70 MHz through 200 MHz, of an external clock signal CLKext. Further, various different flip-flops and other equivalent sampling devices may be used. Moreover, transiting edge of the input clock signal CLKin being about ½ in-between transiting edges of two delay clock signals CLK_D(n−1) and CLK_Dn may be varied.

The first output unit 40 includes tri-state or three phase buffers BUF1–BUF(N). When the buffer in enabled by a locking enable signal LEo of a high level, the output OUT of an enabled three-phase buffer provides the delayed clock signal CLK_Dn provided at the input IN. The buffers which are disabled by the locking enable signal of a low level maintain a high impedance state at the output OUT. The buffers are staggerly coupled to the NOR gates of the sampling and computation unit 30. However, the buffers may be coupled in other staggered arrangements or directly coupled to the NOR gates without staggering.

The second output unit 50 includes a plurality of latches L1–Lp, each coupled to outputs OUT of the three phase buffers, and having first and second inverters I1 and I2. The outputs of the latches L1–Lp are logically NORed by a NOR gate 51 to provide an internal clock signal CLKout, which has been further delayed by serially connected inverters I3–I5. The latch L1 is coupled to output OUT of four three-phase buffers whereas the latch L2 is coupled to output OUT of two three-phase buffers. As can be appreciated, such arrangements can be changed, and the inverters I3–I5 may not be necessary.

Figure 2:
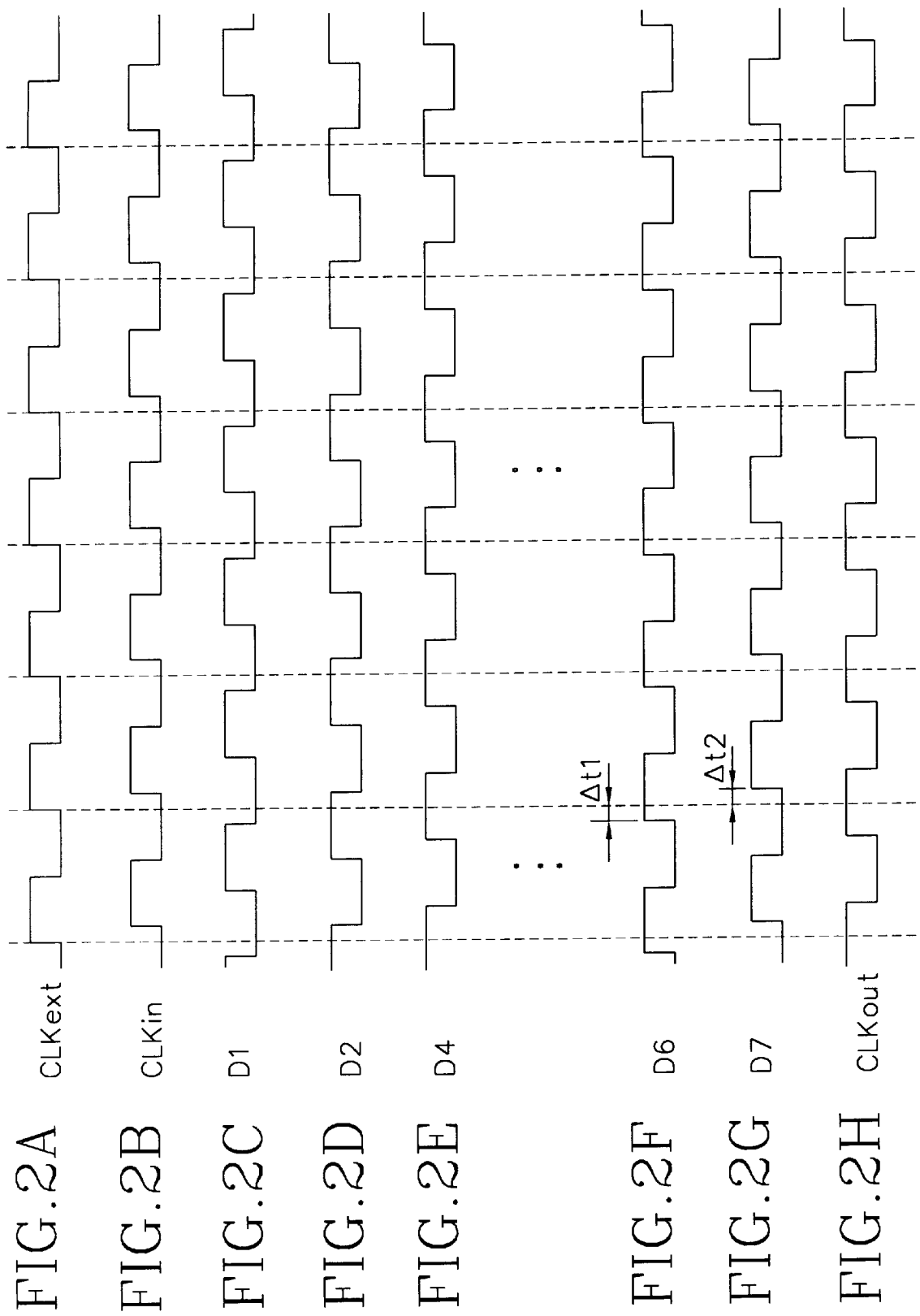
FIGS. 2A through 2H are waveform diagrams of signals within the circuit of FIG. 1.

The operation of the negative delay circuit of FIG. 1 is described with reference to FIGS. 2A–2H. When an external clock signal CLKext, as shown in FIG. 2A, the input clock signal CLKin of FIG. 2B from the input buffer 10 is sequentially delayed by the unit delay terminals D1 through Dn of the delay unit 20. See, e.g., FIGS. 2C–2G.

As shown in FIGS. 2F and 2G, the transiting edge of delayed clock signals CLK_D6 and CLK_D7 is about ½ in-between the transiting edge of the input clock signal CLKin, i.e., Δt1=Δt2. When such a condition is sampled by the sampling and computation unit 30, the flip-flops FF4–FFm output low and high.

The NOR gates NR1–NRm perform a logical NOR operation on the signals provided from the output terminals Q and /Q. The NOR gate NR4 outputs a lock enable signal LE4 whereas the remaining NOR gates NR1–NR3 and NR5–NRm provide enable signal LE1–LE3 and LE5-LEo of a low level. The enabled buffer BUF4 provides the delayed clock signal CLK_D4 to the output OUT, which is latched by the latch L1 of the second output unit 50. The non-enabled buffers provide a high impedance state at the output OUT. The output from the latch L1 is NORed by the NOR gate 51, and the internal clock signal CLKout, as shown in FIG. 2H, is provided after being delayed by inverters I3–I5.

As described above, a multi-locking prevention circuit for a negative delay circuit according to the present invention is capable of preventing a multi-locking phenomenon and reducing a current consumption by maintaining the levels of signals from the unit delay terminals connected after a unit delay terminal, in which a locking phenomenon occurs to a predetermined level when a locking phenomenon occurs in a unit delay terminal in a high frequency region.

However, the above negative delay circuit may a require an increased number of the unit delay stages in order to be operable in a frequency range of a wide band. In the case of the low frequency, a locking takes place at a rear stage of the negative delay circuit, and in the case of the high frequency, a locking takes place at a front stage thereof. Therefore, in order to operate the negative delay circuit in a wide band frequency range of the external clock signal CLKext, not only the unit delay stage but also the number of components in the sampling and computational unit 30 and output unit 40 may increase. As a result, when the negative delay circuit is operated in the wide band frequency range, a size of a chip may increase.

In the case that the negative delay circuit is operated in a high frequency region, a multi-locking, namely, a locking takes place in the unit delay stage D2n as well as the unit delay stage Dn, thereby generating two locked clock signals. Although the two locked clock signals have an identical timing in theory, there existed a little timing difference therebetween. The timing difference is NORed in the NOR gate, and consequently a clock timing of a finally-outputted internal clock signal CLKout may be changed. In addition, the locking takes place not only in the unit delay stage Dn but also in the unit delay stage D2n, and thus, a device after the unit delay stage Dn is unnecessarily operated, which results in an increased current consumption.

Figure 3:
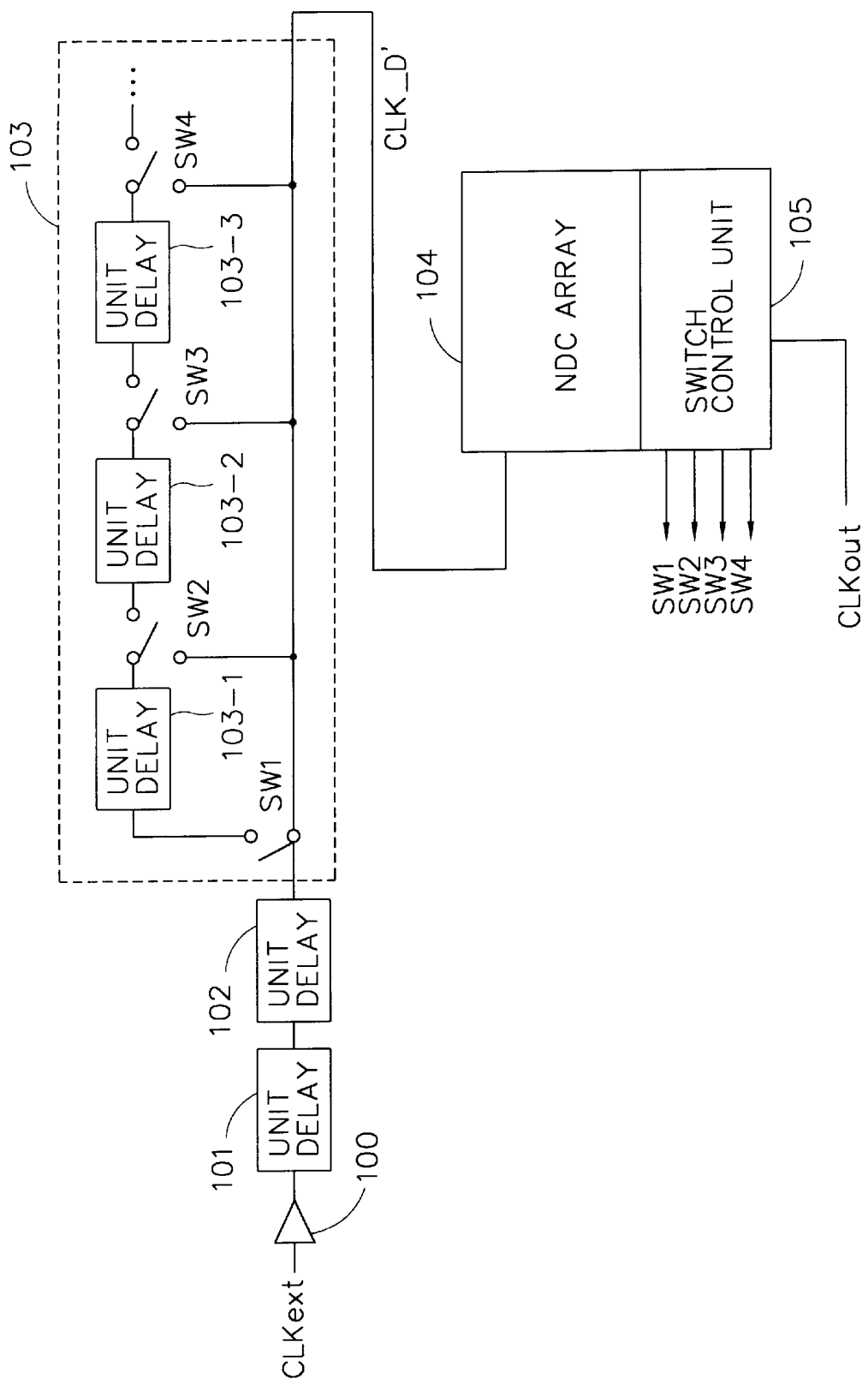
FIG. 3 is a block diagram illustrating a negative delay circuit operable in a wide band frequency in accordance with another preferred embodiment of the present invention.

FIG. 3 illustrates a negative delay circuit in accordance with another embodiment of the present invention which is operable in a wide band frequency and has a small-sized chip. An input buffer 100 buffers an external clock signal CLKext and unit delay stages 101, 102 sequentially delay an output of the input buffer 100. A delay variable unit 103 delays an output of the unit delay stage 102 by varying a number of the unit delay stages according to switch control signals SW1–SW4. A negative delay circuit NDC array 104 receives an output of the delay variable unit 103 and outputs a locked internal clock signal CLKout. A switch control unit 105 outputs the switch control signals SW1–SW4 when a locking range exceeds the NDC array 104.

Figure 4:
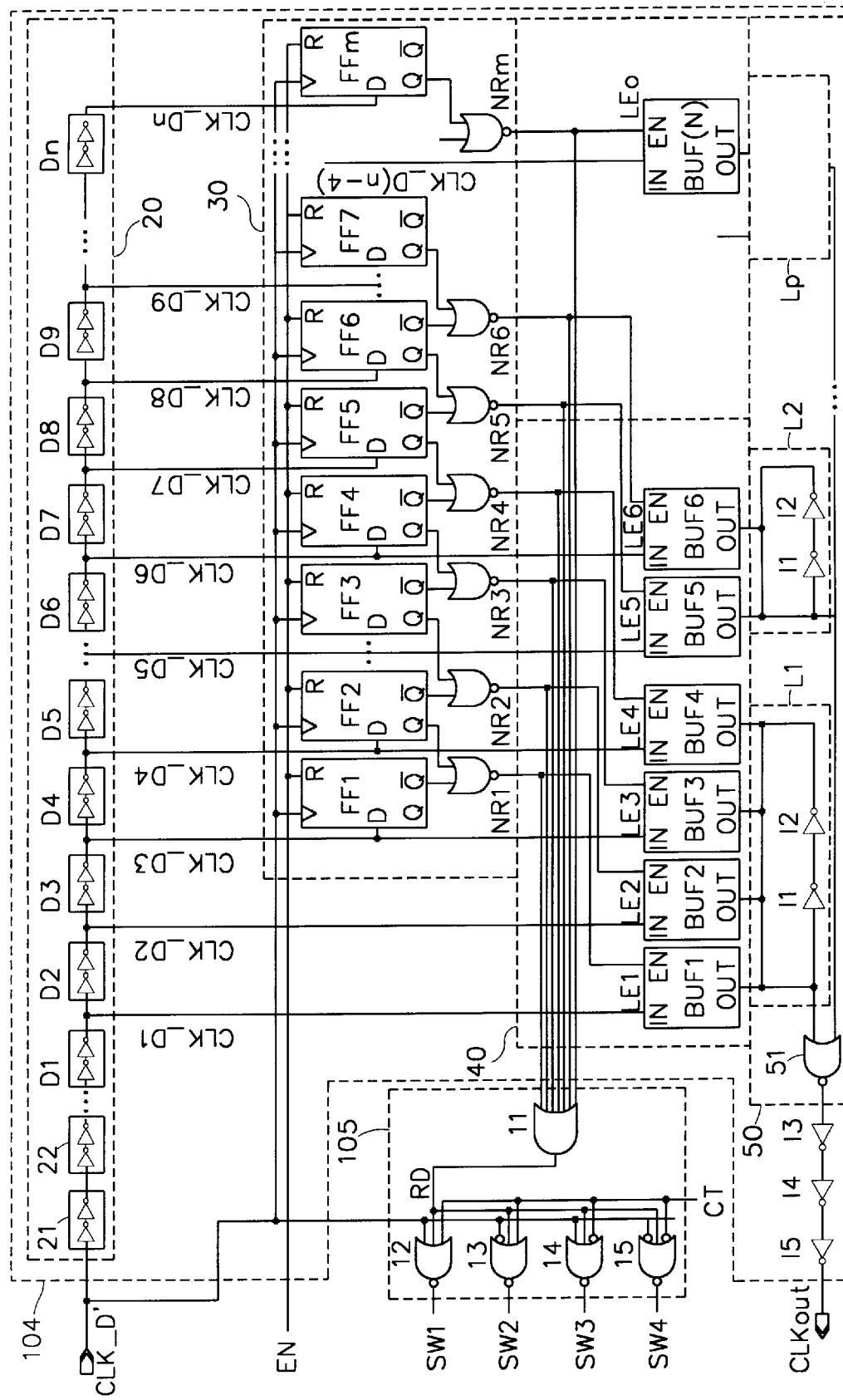
FIG. 4 is a detailed circuit diagram illustrating an NDC array and a switch control unit of FIG. 3.

As illustrated in FIG. 4, the switch control unit 105 includes: an OR gate 11 outputting a locking detecting signal RD by ORing a locking enable signal LEo outputted from the sampling and computational unit 30 in the NDC array 104; and NOR gates 12–15 outputting the switch control signals SW1–SW4 by respectively NORing a delay clock signal CLK_D' outputted from the delay variable unit 103, the locking detecting signal RD outputted from the OR gate 11, and a count signal CT.

In a high frequency region, the external clock signal CLKext shown in FIG. 2A is changed to a signal depicted in FIG. 2B through the input buffer 100. The output of the input buffer 100 is sequentially delayed by the unit delay stages 101, 102. When the switch control signals SW1–SW4 outputted from the switch control unit 105 are all in a low level, the output of the unit delay stage 102 is inputted to the NDC array 104 as the delayed clock signal CLKD'.

The delay unit 20 in the NDC array 104 receives a delay clock signal CLK_D' outputted from the unit delay stage 102, and sequentially delays the delay clock signal CLK_D' through a plurality of unit delay stages D1–Dn. A plurality of flip-flops FF1–FFm in the sampling and computational unit 30 is enabled by a high-level enable signal EN, and samples the delay clock signals CLK_Dn outputted from the unit delay stages D1–Dn according to the delay clock signal CLK_D' outputted from the unit delay stage 102.

When a delayed clock signal from a unit delay terminal is locked, e.g., when a transiting edge of the input clock signal CLKin is preferably about ½ in-between transiting edges of two delayed clock signals CLK_D(n−1) and CLK_Dn, the flip-flop coupled to the clock signal CLK_D(n−1) and the flip-flops thereafter output low and high level signals, respectively, at the output terminals Q and/Q of the flip-flops. The flip-flops coupled to the clock signal prior to CLK_D(n−1), i.e., flip-flops coupled to unlocked delayed signals of the unit delay terminal, output high and low levels at the output terminals Q and /Q, respectively, of the flip-flops.

For example, as shown in FIGS. 2F and 2G, the transiting edge of delayed clock signals CLK_D6 and CLK_D7 is about ½ in-between the transiting edge of the input clock signal CLKin, i.e., Δt1=Δt2, When such a condition is sampled by the sampling and computation unit 30, the flip-flops FF4–FFm output low and high.

The NOR gates NR1–NRm perform a logical NOR operation on the signals provided from the output terminals Q and /Q. The NOR gate NR4 outputs a lock enable signal LE4 whereas the remaining NOR gates NR1–NR3 and NR5–NRm provide enable signal LE1–LE3 and LE5-LEo of a low level.

Accordingly, a three-state buffer BUF4 in the output unit 40 is enabled by the high-level locking enable signal LE4, and serves to output a delay clock signal CLK_D4 outputted from a unit delay stage D4 through a NOR gate 50 and inverters I3, I4, I5. Therefore, a locked internal clock signal CLKout shown in FIG. 2H is outputted.

However, when a frequency of the external clock signal CLKext is changed high to low, in the case of a low frequency, a locking takes place at the back portion of the NDC array 104. Accordingly, as the frequency is lowered, it is more likely that a locking, which is generated within the NDC array 104, exceeds a range of the NDC array 104.

In case a locking exceeds the range of the NDC array 104, the locking enable signals LEn outputted from the sampling and computational unit 30 are all in a low level (locking fail), and thus the switch control unit 105 outputs the high-level switch control signals SW1–SW4 according to the locking fail signal. As a result, according to the switch control signals SW1–SW4, a number of the unit delay stages enabled in the delay variable unit 103 is increased. Therefore, a locking region exists within the range of the NDC array 104 during low frequency operation.

That is, when it is presumed that a locking is generated in the input buffer 100, the unit delay stages 101, 102 and the NDC array 104 in the high frequency region, and as the frequency lowers, the locking region exceeds the range of the NDC array 104. At this time, the locking enable signals LEn outputted from the sampling and computational unit 30 are all in a low level, and thus, the OR gate 11 of the switch control circuit 105 outputs a low-level locking detecting signal RD.

As illustrated in FIG. 5, the NOR gate 12 outputs the high-level switch control signal SW1 when the locking detecting signal RD of the OR gate 11, the delay clock signal CLK_D' of the unit delay stage 102 and a count signal CT are all '0'. Here, the count signal CT is a signal counting a period of the delay clock signal CLK_D'. Therefore, according to the high-level switch control signal SW1, a unit delay stage 103-1 is additionally connected. The delay clock signal CLK_D' varied through the unit delay stage 103-1 is re-inputted to the NDC array 104, and thus the locking fail signal is detected.

In case the locking fail signal is re-detected in the NDC array 104, when the locking detecting signal RD of the OR gate 11, the delay clock signal CLK_D' of the unit delay stage 103-1 and the count signal CT are respectively '0', '1' and '0', the NOR gate 13 outputs the high-level switch control signal SW2, thereby additionally connecting a unit delay stage 103-2. Identically to the above-described process, the NOR gate 14 outputs the high-level switch control signal SW3 when the input signals are respectively '0', '0' and '1', thereby connecting a unit delay stage 103-3.

When the delay clock signal CLK_D' is inputted to the NDC array 104 through the unit delay stage 103-3, if the locking fail signal is not detected, that is, the locking takes place in the NDC array 104, and as illustrated in FIG. 5, the locking detecting signal RD of the OR gate 11, the delay clock signal CLK_D' of the unit delay stage 103-3 and the count signal CT are all '1', the NOR gate 15 outputs the low-level switch control signal SW4, and thus a connecting process of a unit delay stage 103-4 is interrupted.

It should be recognized that the present invention is not limited by the switch control signals SW1–SW4. The unit delay stages can be additionally connected by increasing a number of the switch control signals SW by the count output CT.

Consequently, the delay clock signal CLK_D4 of the unit delay stage D4 is locked in the NDC array 104 when the transiting edge of the delayed clock signals CLS_D6 and CLK_D7 is about ½ in between the transiting edge of the input clock signal CLKin. In addition, the three-state buffer BUF4 in the output unit 40 is enabled by the high-level locking enable signal LE4 outputted from the sampling and computational unit 30, and serves to output the delay clock signal CLK_D4 outputted from the unit delay stage D4 through the NOR gate 50 and the inverters I3, I4, I5, thereby outputting the locked internal clock signal CLKout.

As described above, according to the present invention, the locking is carried out in the high frequency region by using the NDC array including a predetermined number of the stages, and a number of the unit delay stages positioned at the input terminal of the NDC array is varied according to the locking fail signal in the low frequency region, thereby operating the NDC in the wide band even when a number of the stages of the NDC array is small and reducing a chip size thereof.

In addition, according to the present invention, the NDC array has a delay value less than one clock, the locking is prevented from re-occurring at a stage in a back portion thereof, which results in a reduction of a unnecessary current consumption.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A negative delay circuit comprising:
   a variable delay unit having a plurality of unit delay stages for delaying a first clock signal, each unit delay stage being coupled to a clock signal line by a switch in response to a switch control signal;
   a negative delay circuit (NDC) array coupled to the clock signal line for receiving an output of the variable delay unit and outputting a locked enable signal; and
   a switch control unit for detecting a locking fail signal from the NDC array and outputting a corresponding switch control signal to the delay variable unit such that corresponding unit delay stages are coupled to the clock signal line, wherein said NDC array comprises:
      a delay unit that sequentially delays the output from said variable delay unit to generate a plurality of delayed signals; and
      a selector that selects one of said plurality of delayed signals when a transiting edge of the output from said variable delay unit is between two transiting edges of two delayed signals from said plurality of delayed signals by a prescribed time period.

2. The negative delay circuit of claim 1, wherein the switch control unit comprises:
   a first logic gate for outputting a locking detecting signal by carrying out a first logic operation on the locked enable signal outputted from said NDC array; and
   a plurality of second logic gates, each outputting the switch control signal by performing a second logic operation on the output from the variable delay unit, the locking detecting signal outputted from said first logic gate and a count signal.

3. The negative delay circuit of claim 2, wherein the count signal is a signal counting a period of the output from the variable delay unit.

4. The negative delay circuit of claim 2, wherein the plurality of second logic gates of the switch control unit vary the number of unit delay stages coupled to the clock signal line.

5. The negative delay circuit of claim 2, wherein said first logic gate is an OR gate and each of said plurality of second logic gates is a NOR gate.

6. The negative delay circuit of claim 1, wherein said delay unit includes a plurality of unit delay terminals for generating the plurality of delayed signals, respectively, each sequentially delaying the output from the variable delay unit.

7. The negative delay circuit of claim 1, wherein said selector includes:
   a sampling and computation unit coupled to said delay unit that samples the plurality of delayed signals to determine whether the transiting edge of the output from the variable delay unit is between the two transiting edges of two delayed signals from said plurality of delayed signals by the prescribed time period and outputs the locked enable signal; and
   an output unit coupled to said sampling and computation unit to receive the locked enable signal and coupled to said delayed unit to receive said plurality of delay signals, said output unit outputting one of said plurality of delayed signals based on the locked enable signal.

8. The negative delay circuit of claim 7, wherein said sampling and computation unit includes:
   a plurality of flip-flops, each coupled to the clock signal line and receiving a corresponding delayed signal; and
   a plurality of logic gates, each receiving an output from two of said plurality of flip-flops to output the locked enable signal.

9. The negative delay circuit of claim 8, wherein said plurality of logic gates comprises a plurality of NOR gates.

10. The negative delay circuit of claim 8, wherein each logic gate receives an output of two adjacent flip-flops.

11. The negative delay circuit of claim 8, wherein said plurality of logic gate comprises a plurality of NAND gates coupled to receive the output from two of said plurality of flip-flops.

12. The negative delay circuit of claim 6, wherein each of said plurality of delayed unit terminals comprises a plurality of inverters coupled in series.

13. The negative delay circuit of claim 6, wherein each said plurality delayed unit terminals comprises a logic gate and an inverter coupled in series.

14. The negative delay circuit of claim 13, wherein at least one logic gates of corresponding delayed unit terminals receives a corresponding locked enable signal which indicate whether the transiting edge of the output from the variable delay unit is between transiting edges of two delayed signals from said plurality of delayed signals by the prescribed time period.

15. The negative delay circuit of claim 13, wherein said logic gate is a NAND gate.

16. The negative delay circuit of claim 13, wherein corresponding input of corresponding logic gates is coupled to a prescribed voltage.

17. The negative delay circuit of claim 16, wherein the prescribed voltage is one of a source voltage and a ground voltage.

18. The negative delay circuit of claim 1, wherein the transiting edges of two delayed signals from said plurality of delayed signals are about equal time period from the transiting edge of the output from the variable delay unit.

19. The negative delay circuit of claim 7, wherein said output unit comprises:

a first output unit having a plurality of buffers, each buffer coupled to receive a corresponding locked enable signal from said sampling and computation unit; and a second output unit having a plurality of latches, each latch coupled to corresponding number of buffers and a logic gate for performing a logical operation based on the output signals of said plurality of latches.

20. The negative delay circuit of claim 19, wherein said buffers are tri-state buffers.

21. The negative delay circuit of claim 19, wherein each of said plurality of latches comprises serially coupled inverters in a latch configuration.

22. The negative delay circuit of claim 1, further comprising an input buffer for buffering an external clock signal to provide the first clock signal.

* * * * *